United States Patent [19]

Hynecek

[11] Patent Number: 4,821,081
[45] Date of Patent: Apr. 11, 1989

[54] LARGE PITCH CCD WITH HIGH CHARGE TRANSFER EFFICIENCY

[75] Inventor: Jaroslav Hynecek, Richardson, Tex.

[73] Assignee: Texas Instruments Incorporated, Dallas, Tex.

[21] Appl. No.: 70,623

[22] Filed: Jul. 6, 1987

Related U.S. Application Data

[63] Continuation of Ser. No. 770,321, Aug. 27, 1985, abandoned.

[51] Int. Cl.⁴ .................... H01L 29/78; G11C 19/28
[52] U.S. Cl. ............................................ 357/24; 377/58
[58] Field of Search ............... 357/24, 30; 377/57-63

[56] References Cited

U.S. PATENT DOCUMENTS 4,229,752 10/1980 Hynecek .................... 357/24 M
4,242,692 12/1980 Hagiwara .................... 357/24 R Primary Examiner—Gene M. Munson
Attorney, Agent, or Firm—George L. Craig; Leo N. Heiting; Melvin Sharp

[57] ABSTRACT

A CCD structure wherein the patterned well implant and/or patterned barrier implant geometries are modified to exploit two dimensional potential modification effects to induce potential gradation along the length of the CCD pixel. Preferably these geometry modifications are in the form of wedge-shaped extensions of the well doping into the barrier region. The modifications thus induced to the potential profile for electrons in the direction of the charge transfer along the CCD pixel mean that the regions of flat potential, wherein carrier transport is diffusion dominated, are shortened, so that charge transfer efficiency can be improved at reasonably high clock rates.

12 Claims, 6 Drawing Sheets

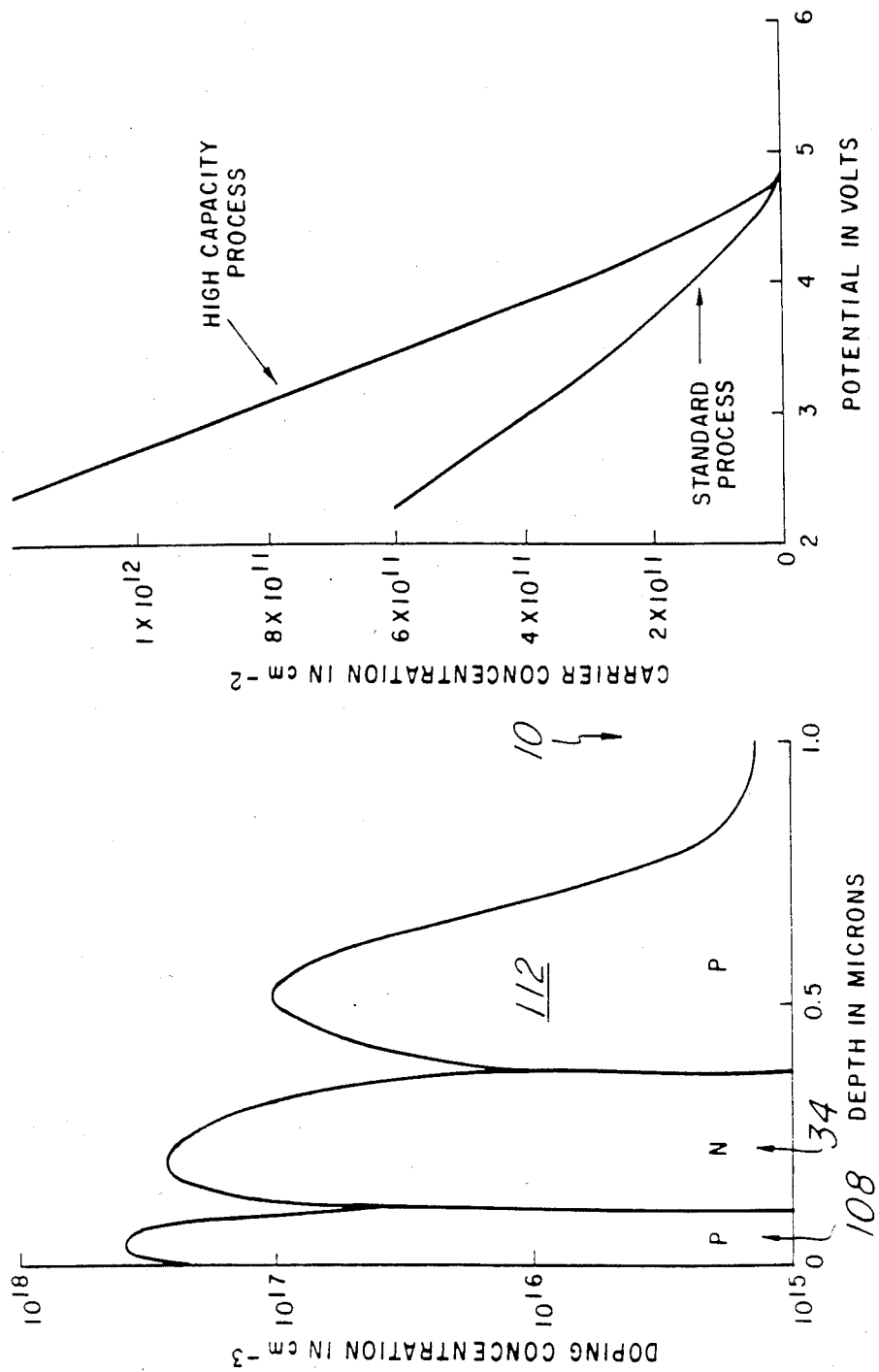

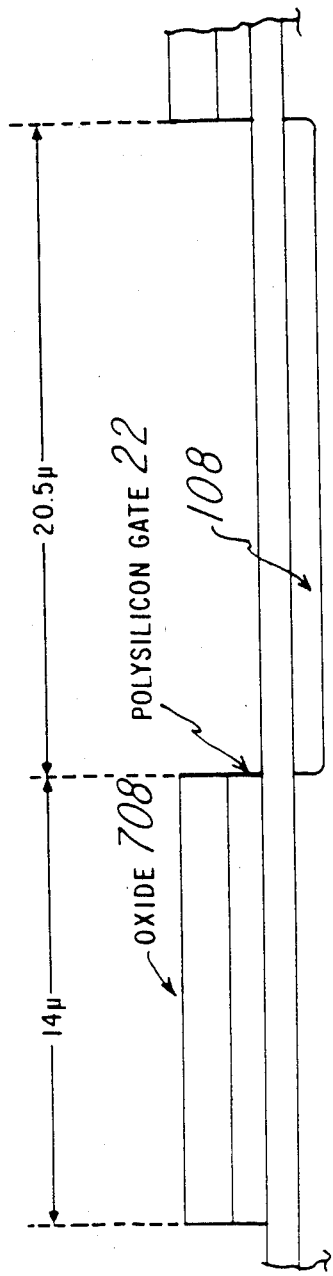
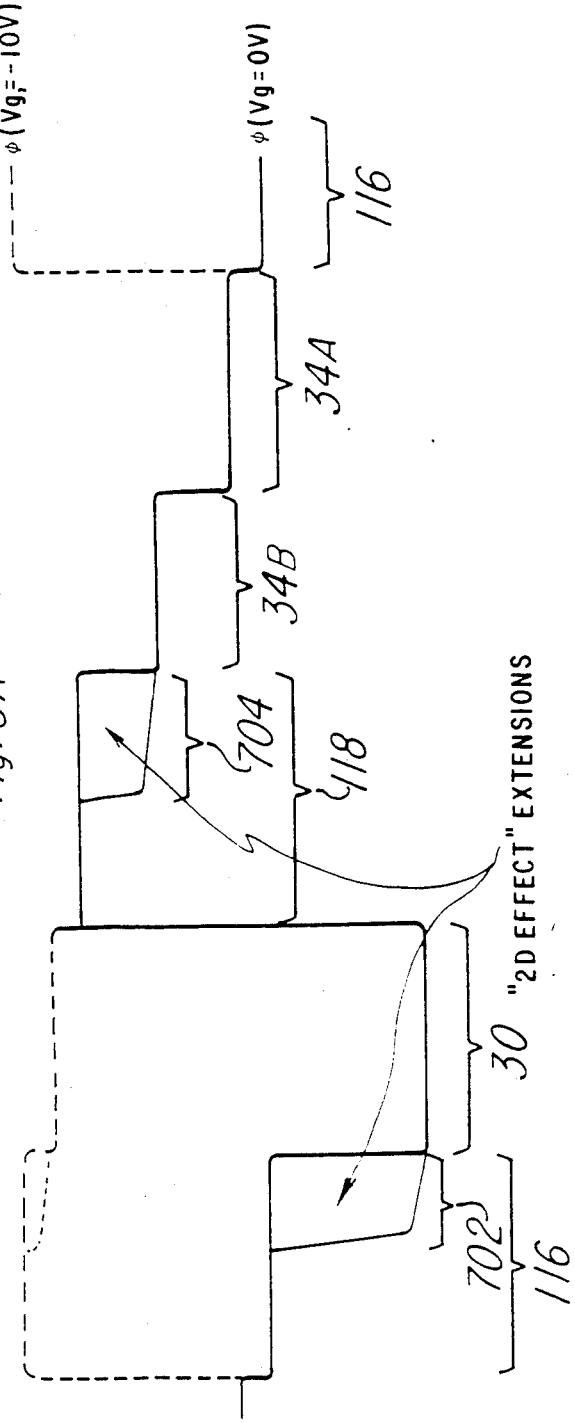
Fig. 6A
Fig. 6B

LARGE PITCH CCD WITH HIGH CHARGE TRANSFER EFFICIENCY

This application is a continuation of application Ser. No. 770,321, filed Aug. 27, 1985, now abandoned.

BACKGROUND AND SUMMARY OF THE INVENTION

The present invention relates to CCD devices. The present invention particularly relates to area CCD imagers having multiplexed serial output registers.

A problem in CCDs with relatively large pixel dimensions is that, in any portion of a single CCD element wherein the potential profile for carriers is flat, carrier transport will be diffusion-dominated. This means that a tradeoff between charge transfer efficiency and clock rate becomes necessary, at least if reasonably high clock rates are desired. This tradeoff is extremely undesirable, since the application desired (for example NTSC compatibility) will often strictly dictate the clock rates which must be used, and any degradation whatsoever in charge transfer efficiency is extremely undesirable.

To avoid this tradeoff, the prior art teaches modification of the CCD pixel structure to create potential gradients within a single pixel. That is, for example, instead of a single clocked well implant, multiple clocked well implants might be used. That is, under the clocked electrode, there will be not merely two potential levels (barrier and well) but three or more (for example, upper barrier, lower barrier, and well). That is, without modifying the highest and lowest potential levels within a single phase of the CCD, intermediate potential levels may be introduced, to reduce the width of regions of flat potential, so that more of the carrier transport distance is dominated by potential gradient rather than by carrier diffusion statistics.

However, the prior art method of using multiple implants to do this (one implant for each additional potential level) is very expensive; anything which introduces an additional mask level into a process is undesirable.

The present invention teaches an alternative way to achieve modification of the potential profile to assist carrier transport within large CCD elements; the mask geometry of the patterned implants is modified. For example, in the context of a virtual phase CCD process, the patterned virtual well implant can be modified so that it includes small wedge-shaped protrusions, where small portions of the virtual well implant extend out into the virtual barrier region. That is, the boundary between the virtual well and the virtual barrier does not extend straight across the channel width, but is interrupted by these wedge-shaped protrusions. Two-dimensional effects at the boundaries of these protrusions cause a potential modification. That is, the relatively narrow protrusions themselves have a higher potential than the virtual well, due to the two dimensional effects, and this itself creates an additional intermediate potential level, without any additional patterning. This itself is a first teaching of the invention, and provides numerous key advantages.

A further teaching of the invention is that these relatively narrow protrusions should be tapered, so that not only is an intermediate level of potential provided, but this level of potential is itself subject to a potential gradient. That is, the present invention not only provides a third (intermediate) potential level between the flat potentials of the virtual barrier and virtual well, but this intermediate potential level is itself graduated, which further reduces the transport distance over which carrier transport is diffusion-dominated.

Such enhancements to carrier transport may be advantageous where very large pixels are used in the imaging area, e.g. for long integration time (low light level) or rad-hard devices, or in the memory array area of a device using on-chip integration of multiple imaged charge packets into a single memory charge packet; but the primary need for this technology arises in serial transfer registers, particularly where the serial transfer registers are multiplexed onto more than one column of a CCD array and are operated generally at high clocking frequencies In color imagers generally, it is desirable to segregate the column outputs into more than one serial register and output amplifier. Separation of the color channels also assists in off-chip processing. For example, an area CCD imager with RBG color filter striping overlaid on the imager could be multiplexed onto three serial output registers, so that the CCD pixel pitch of each of the serial output registers would have to be three times the horizontal column separation of the CCD array. For even a reasonably small array, e.g., an eleven millimeter diagonal 488 by 780 array, this can require very large pixel sizes in the serial output registers, e.g., 20 microns or more pixel pitch. This pitch is large enough that diffusion-dominated transport can lead to degraded CTE at the clocking rates required for NTSC compatibility.

Thus it is an advantage of the present invention that high charge transfer efficiency can be achieved in large-pitch CCD pixel structures without requiring additional masking steps.

It is a further advantage of the present invention that high charge transfer efficiency at high clocking rates can be achieved in area CCD imaging arrays having column outputs multiplexed onto to more than one serial output register.

According to the present invention there is provided: A CCD structure comprising: a plurality of pixels connected in series along a CCD channel, each said pixel comprising a plurality of adjacent phases, each said phase comprising A well region, a barrier region, and at least one intermediate potential region between said well region and said barrier region, said well region adjoining a barrier region of a different one of said phases and said barrier region adjoining a well region of a different one of said phases; wherein at least some of said pixels comprise, in at least one phase thereof, a boundary of at least one of said intermediate potential regions which is not straight, but includes protrusions directed approximately along said channel, said protrusions being substantially narrower than the width of said channel.

BRIEF DESCRIPTION OF THE DRAWING

The present invention will be described with reference to the accompanying drawings, wherein:

FIGS. 4A and 4B show doping profiles and the corresponding charge-potential curve for a new high-well-capacity CCD process using deep p-type regions 112 as shown in FIG. 1. A charge-potential curve for a standard process is shown for a comparison.

FIGS. 6A and 6B show an example of the potential energy profiles which are achieved by this structure.

DESCRIPTION OF THE PREFERRED EMBODIMENTS

The process preferably used in manufacturing devices in accordance with various of the points of novelty taught by the present application will first be described in detail.

Processing

Figure 2A:
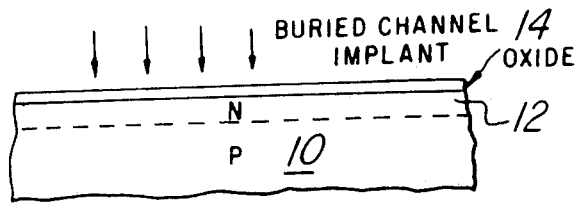
FIGS. 2A–2C show an example of a prior art method of making a CCD, in which the channel stops extend uniformly under the clocked and virtual gates.
Figure 2B:
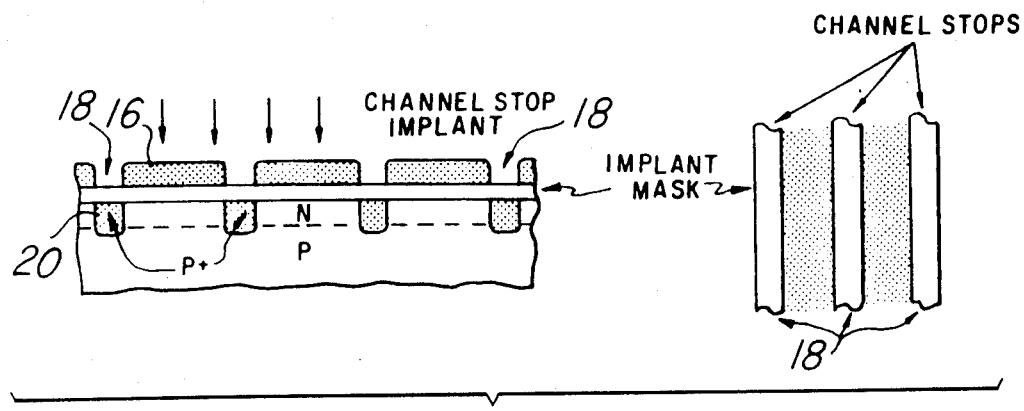
Figure 2C:
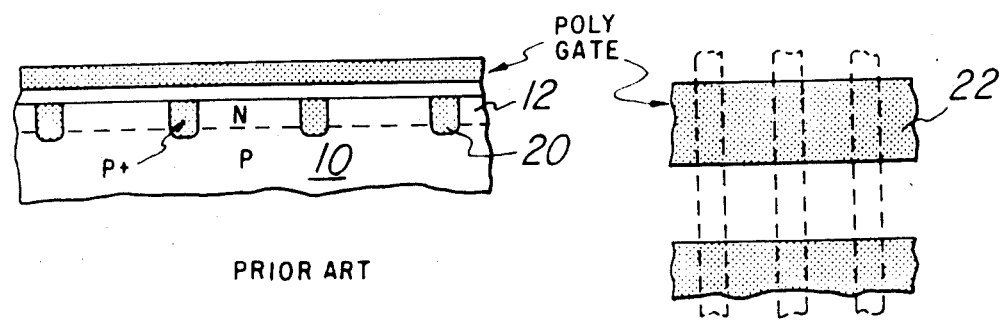

FIGS. 2A–2C shows an example of a prior art method of making a CCD. A p-type substrate 10 has an oxide 14 grown on it, and then a blanket buried channel implant forms a surface layer 12 which is n-type. (Alternatively, the surface layer 12 may be grown epitaxially instead of implanted.) An implant mask 16 is patterned to expose channel stop locations 18. P-type implantation then results in the formation of p+ channel stops 20, as shown in FIG. 2B. Finally, clocked wells are implanted, and the poly gate 22 is patterned across the lines of channel stops. The patterning of the poly gate 22 defines the location of the clocked phases along the channels.

Figure 3A:
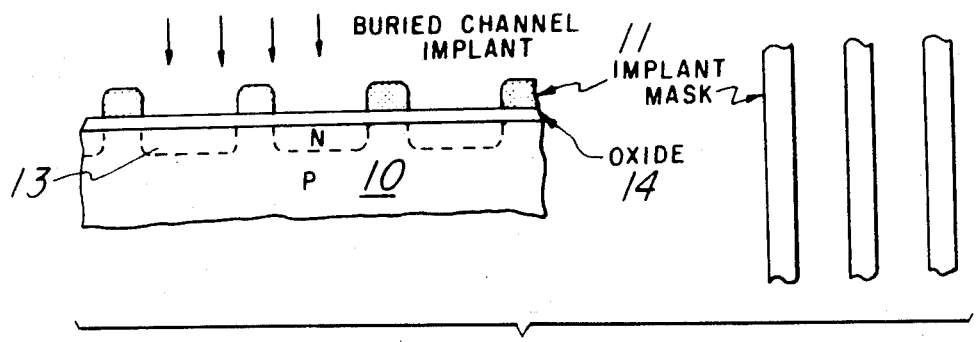
FIGS. 3A–3C show key steps in a novel method of making a CCD, using a two-mask channel definition process.
Figure 3B:
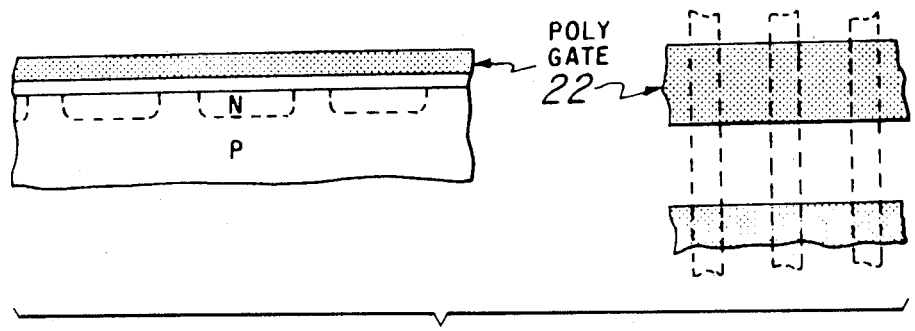
Figure 3C:
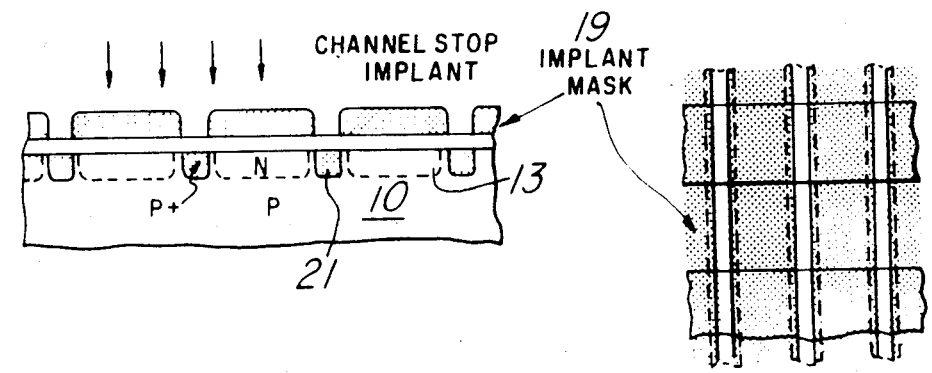

In the present invention, an extra mask step is added, and the order of the steps is changed, to produce substantial advantages. Key steps in the process of the present invention are shown in FIGS. 3A–3C. The first difference, as shown in FIG. 3A, is that the buried channel implant is patterned by an implant mask 11, to produce patterned channels 13 as opposed to the blanket layer 12 using the prior art. Then (after the clocked wells have been formed), the poly gate 22 is patterned, as shown in FIG. 3B. Next, a channel stop implant is screened by an implant mask 19, to produce patterned p+ channel stop regions 21 as shown in FIG. 3C.

Thus, since the channel stop implant is applied after the poly gate 22 has been patterned, the p+ channel stops 21 do not extend continuously along the full region of the channel, but are interrupted every time they are intersected by a portion of a poly gate level 22. This means that the width of the channel diffusion 13 under the poly gate 22 is increased, since there is no p+ region 21 to outdiffuse in these regions. This means that the capacity of the clocked well is increased.

To correspondingly increase the capacity of the virtual phase well, one additional (Hi-C) implant is preferably performed. This is a deep p-type implant, with a stopping distance near or below the bottom junction location which will be defined by the doping profile of the buried channel locations 13. Thus, the capacity of both virtual phase and clocked phase is increased.

The foregoing description summarizes a few of the key features which distinguish the present invention from the prior art. The fabrication process will now be discussed in great detail, with primary reference to the CCD array. Additional masks and fabrication steps may be used for fabrication of the periphery, including some which are entirely conventional in NMOS logic and will not be discussed in any great detail. Also, many minor processing steps (such as cleanups, growth of anti-Kooi-effect oxide, stripping of masks, etc.) are omitted, because they are very widely known and their insertion at appropriate points is totally obvious to anyone skilled in the art.

It should also be noted that the following description gives many specific implant dose and energy specifications. These are illustrative only, provided to better permit one skilled in the art of fabricating semiconductor devices to make and use the various inventions disclosed, and do not limit the scope of the invention. In particular, the currently preferred ranges for dose and energy are given; but, as is well known to processing engineers, such specifications may be very widely varied. Many of the parameters given may be varied by plus or minus 50% or more, depending on the tradeoffs exploited by the process engineer. As is well known, there are innumerable tradeoffs between the parameters of any one implant step and oxide thicknesses, supply voltage, annealing conditions, the parameters of other implant steps, etc. Moreover, many substitutions of technologies can be made (to name only one example, sidewall masked isolation could be used instead of LOCOS), and steps can be interchanged and modified as well.

Many parts of the specification of the present patent application have particular reference to a process which uses virtual phase CCD technology. Background on virtual phase CCD technology can be found in the following articles, all of which are hereby incorporated by reference: Hynecek, "Virtual Phase Technology: a New Approach to Fabrication of Large-area CCDs," 28 IEEE Transactions on Electron Devices 483 (1981); Hynecek, "Electron-Hole Recombination Antiblooming for Virtual-Phase CCD Imager," 30 IEEE Transactions on Electron Devices 941 (1983); Hynecek, "Design and Performance of a Low Noise Charge Detection Amplifier for VPCCD Devices," 31 IEEE Transactions on Electron Devices 1713 (1984); Hynecek, "Design and Performance of a High-resolution Image Sensor for Color TV Applications," forthcoming in the August 1985 issue of IEEE Transactions on Electron Devices; and U.S. Pat. No. 4,229,782, which is also hereby incorporated by reference. However, many of the innovations described are perfectly applicable to other CCD technologies as well. Virtual phase technology is referred to so extensively merely because (1) it represents the currently contemplated best mode of using the various inventions described, and (2) it is often more advantageous to apply various innovations described here in the context of virtual phase technology than it would be in the context of other CCD technologies—i.e. the innovations are applicable and advantageous in many other technologies, they are simply more advantageous in virtual phase technology.

The processing sequence preferably used will now be described in great detail.

A substrate having a monocrystalline semiconductor upper portion, for example a p—on—p+ silicon wafer having a 10 micron thick epitaxial layer doped to around $1 \times 10^{15}/cm^3$ p-type, is provided as starting material.

The first masking step used is a moat masking step. This is used, as is conventional, to pattern a silicon nitride masking layer; the openings in the nitride layer expose selected regions to a LOCOS-channel-stop implant (e.g. $1 \times 10^{14}/cm^3$ of boron at 60 keV) and then to a long oxidation, in order to form LOCOS isolation surrounding moat regions (moat regions are the regions where active devices are to be formed) in the periphery. Since no oxide isolation is needed in the CCD array, the whole array is masked from the field oxidation steps.

Next, a source/drain mask is used to mask off the entire CCD array (except for diode locations, such as the clearing diodes along the top and bottom edges of the array), so that an n+ source/drain implant can be used to form NMOS devices in the periphery. This implant may be, for example, $3 \times 10^{15}/cm^2$ to $7 \times 10^{15}/cm^2$ of phosphorus at 30–60 keV. Note that this is not a self-aligned source-drain implant, as used in most MOS processes: the virtual well implant will later be used to form source/drain extensions (LDD regions) which are self-aligned to the poly gate level. (This mask is also used to mask a plasma etch which strips the LOCOS nitride from exposed portions of the moat (in the periphery) and from the exposed portios of the CCD array. The portion of the LOCOS nitride under this mask can be removed by wet etching later.) The use of a masked source/drain implant not only provides low-resistance diffused interconnects and LDD structures (which reduce hot-electron problems), but also is advantageous if JFET devices are used in the periphery: the masked source/drain implant means that the JFET channel regions can be screened from this implant. Instead of implanting, this step of introducing dopants may be performed as a $POCl_3$-deposition step instead.

Next, implant mask 11 is patterned to expose the CCD channel regions, and an implant of $1 \times 10^{12}/cm^2$ to $2 \times 10^{12}/cm^2$ of phosphorus at 100–150 keV is applied to form buried channel regions 13, as shown in FIG. 12a.

Next an arsenic implant of $2 \times 10^{14}/cm^2$ to $4 \times 10^{14}/cm^2$ at 20–30 keV is applied to form clocked wells.

Figure 5:
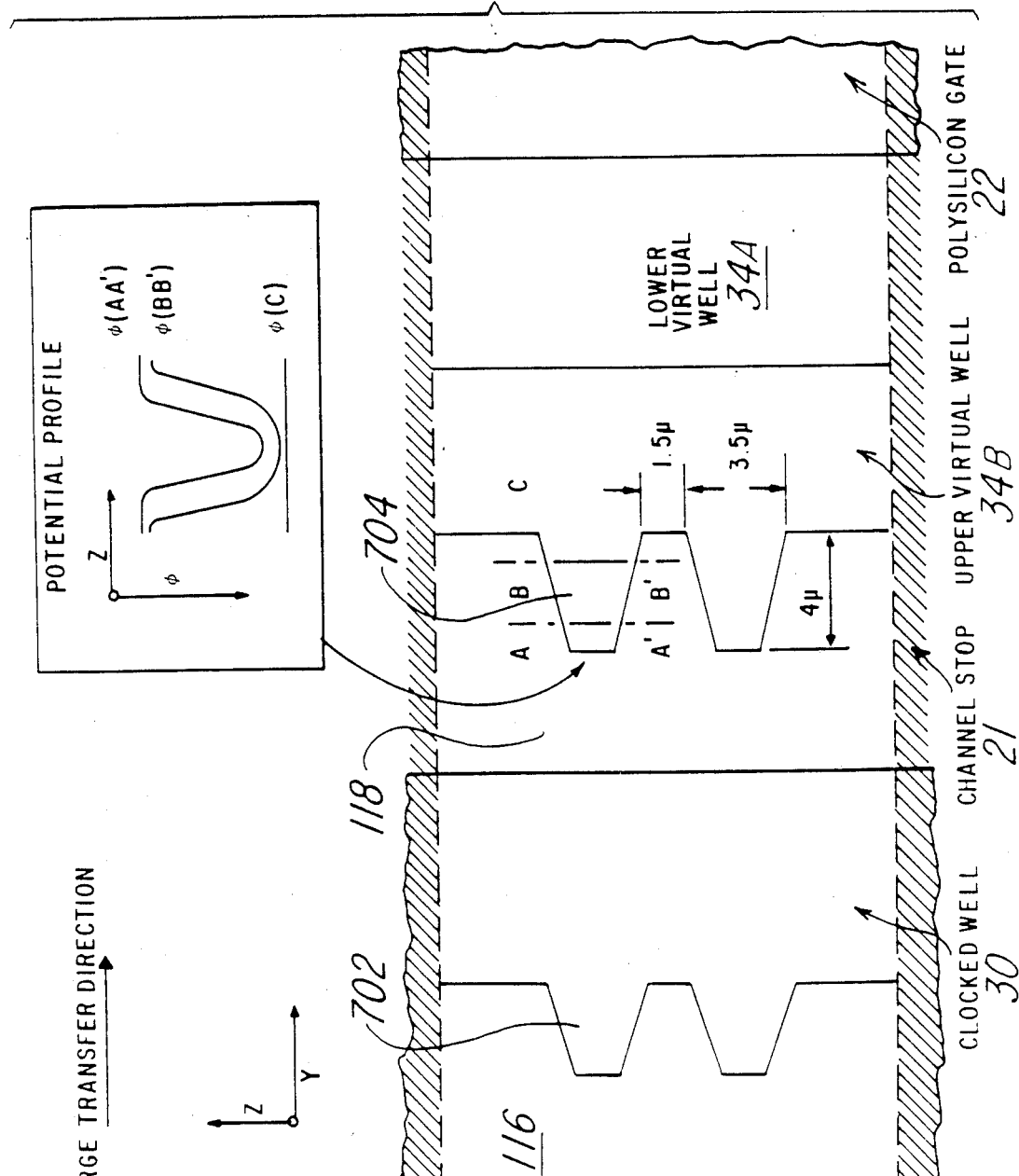
FIG. 5 shows a plan view of the implant masking used, in an alternative class of embodiments which is particularly attractive where pixel spacing is more than 20 microns, to achieve a graded profile of the potential energy for electrons within each CCD pixel, to promote higher charge transfer efficiency.

An alternative class of embodiments can be provided by a modification to this step of the process. FIG. 5 shows a plan view of the wedge-shaped extensions 702 which can be used with the clocked well masking. This alternative class of embodiments is particularly attractive where pixel spacing is more than 20 microns, to achieve a graded profile of the potential energy for electrons within each CCD pixel; such a graded profile promotes higher charge transfer efficiency in large devices. FIG. 6 shows an example of the potential energy profiles which are achieved by this structure.

That is, in large dimension CCDs, the transport of carriers within a large well region will be limited by carrier diffusion statistics except where the carriers are close to the potential gradient at the boundary between the well and the barrier of the succeeding phase. This carrier diffusion process imposes a trade-off between clock frequency and charge transfer efficiency, but it is highly undesirable (particularly in a frame transfer device) to have to make any compromise in either of these parameters. Thus, it has been recognized as desirable, in the prior art, to introduce some potential energy gradation within the wells, to accelerate complete transfer of the carriers to the well boundary when the barrier of the adjacent phase is brought to a lower potential energy.

This can be a problem in the array of large CCDs, but it can also be a particular problem in the multiplexing and serial register portions of CCDs as small as (for example) an 11mm diagonal (488 by 780 pixels) device with three serial registers, where the pitch of each serial register corresponds to three times the horizontal pitch of the array.

Prior art methods of accomplishing this have used multiple implants, but of course each extra implant requires an extra mask level, so that this has been tremendously expensive in terms of processing complexity. A novel way to accomplish this is by the use of two-dimensional potential effects; such effects are known, but the application of them to achieve potential gradation within a single well region in a CCD is believed to be novel. That is, among the novel teachings in this application is that potential gradients within a well can be achieved merely by geometrical modifications to the mask geometries of the patterned implants which already require masking steps, without any requirement for use of additional masking steps.

Figure 1:
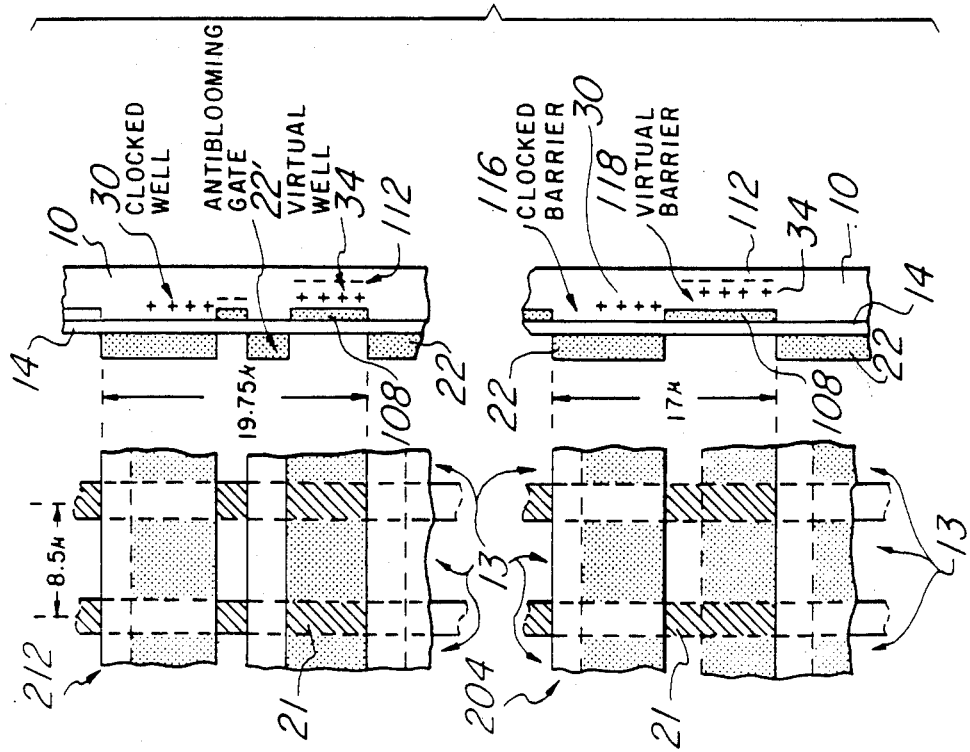
FIG. 1 shows plan and section views of CCD cells in the image area 212 (the top portion of the figure) and storage area 204 (the bottom portion of the figure) for one sample embodiment, namely a 488V×774H frame transfer VPCCD image sensor with 8MM image sensing area diagonal.

In the embodiment shown in FIG. 5, the shape of clocked well 30 is modified to include wedge-shaped extensions 702. The virtual well region 34 shown in FIG. 1 is split, in the embodiment of FIG. 5, into two portions, an upper virtual well 34B and a lower virtual well 34A, where the upper virtual well 34B has a potential energy intermediate between that of the lower virtual well 34A and that of the virtual barrier 118. (One extra mask is required to accomplish this.) Moreover, the upper virtual well 34B is patterned to include wedge-shaped extensions 704 protruding into the virtual barrier 118, and the potential profiles at the top of FIG. 5 show the lateral variation in potential across these wedges along the marked sections A through C. That is, the device structure shown effectively provides two regions of intermediate potential in the virtual phase: one is the "upper virtual well" 34B, which provided in the conventional way at the cost of a mask; but the other is provided by the wedge-shaped extensions, which effectively provide an additional intermediate potential region without requiring an additional masking step. The "upper virtual well" 34B can alternatively be thought of as a lower barrier region, since any charge transferred into upper virtual well 34B will all be collected in the lower virtual well 34A anyway.

FIG. 6 shows potential profiles for the regions of FIG. 5. Note that the potential profiles for the clocked portions 116, 702, and 30 are shown for both states of the polysilicon clocked electrode 22.

Next, gate oxide 14 is grown on all exposed areas of silicon, to a thickness of, for example, 700Å, and poly gate 22 is patterned.

Next, a channel stop implant mask 19 is used to expose channel stop regions 21 to a p-type implant, for example, $1 \times 10^{13}/per\ cm^2$ to $5 \times 10^{13}/per\ cm^2$ of boron at 100–200 keV.

Next, a virtual well implant, for example $1.3 \times 10^{12}/cm^2$ of phosphorus at 200 keV, is performed into areas 34. As discussed above, if it is necessary to create potential gradients within some or all of the virtual wells, the mask for this implant step may be modified to include wedge-shaped extensions, and the mask itself may be split, i.e. an additional mask level may be used to separately pattern both an upper virtual well and a lower virtual well. However, use of this additional mask is not presently preferred.

Next, a blanket virtual barrier implant, for example $1.4 \times 10^{12}/cm^2$ of phosphorus at 300 keV, is preferably performed overall.

The virtual well, virtual barrier, and channel stop implants can be performed in any order. However, one useful and novel teaching of the present application is that the channel stop implant should be patterned after the poly gate 22 has been patterned.

Next, a deep p-type implant, for example $2 \times 10^{12}/cm^2$ of boron at 200 keV or more, is preferably performed. This implant functions as a "Hi-C" implant to increase the capacity of the virtual well locations. This implant is not masked in the array, but may be masked in the periphery to provide control over the turnoff characteristics of the JFET devices and avoid degrading the diode breakdown of the n+ source/drain diffusions.

It is preferable that the gate level 22 be thick enough to stop this implant and the channel stop implant. However, stopping boron at more than 100keV requires a significant thickness of polysilicon, and this conflicts with another goal: to boost quantum efficiency, it is desirable to have the polysilicon gate 22 thin enough to be partially transparent, so that at least some photocarriers can be collected in the clocked wells (in addition to the virtual wells) during the frame exposure period of the imaging array. This will not be practical unless the gate 22 is reasonably thin, e.g. half a micron or less.

To avoid this dilemma, a further novel teaching of this application is that the gate structure should include a thick transparent oxide (not shown) overlying the polysilicon 22. This layered structure is patterned by conventional stack-etching methods. For example, the gate may be polysilicon 2000Å to 3000Å thick and doped to a sheet resistance of around 20 to 100 ohms per square, and the transparent oxide may be CVD or plasma oxide, and be at least 2000Å to 5000Å thick. In future embodiments it may be desirable to scale the poly layer 22 down to 500Å thick. Reducing the thickness of the poly increases its transparency and assists in collecting photocarriers in the clocked wells during the exposure interval, thereby raising the quantum efficiency.

Next, a high-dose low-energy boron implant (which also is blanket in the array, but selectively masked in the periphery) is used to form the virtual phase electrode. This step also forms the gates of JFETs in the periphery. This implant may be, for example, $6 \times 10^{12}/cm^2$ of boron at 35 keV. As shown in FIG. 14b, the virtual phase implant creates the JFET gate 36. The JFET channel region 38 is created by the virtual well and virtual barrier implants.

As will be recognized by those skilled in the art, the present patent application teaches numerous broadly applicable concepts in CCDs. These concepts may be embodied in a tremendous variety of device, processing, and system embodiments, and the scope of the present invention is accordingly not limited except as specified in the claims.

What is claimed is:

1. A charge coupled device (CCD) comprising:
   a semiconductor substrate having mobile charge carriers for moving under the influence of an electric field along adjoining regions of said substrate;
   a first pair of elongated regions including an elongated first region and an elongated second region, each region having a distal end separated by the length of the regions and a proximate end adjoining the other region, said regions having different concentrations of immobile impurities of the same polarity;
   a boundary defined by the proximate ends of said regions and characterized by said different concentrations of said immobile impurities on opposite sides of said boundary;
   an electric field having a potential gradient across said boundary established by the different concentrations of impurities on opposite sides of said boundary, said electric field for attracting mobile charge carriers from the distal end of one region and accelerating the mobile charge carriers across said boundary to the other region;
   said boundary further characterized by a protrusion of a portion of the proximate end of one region into the other region in a direction toward the distal end of said other region for altering the potential gradient of said electric field in the vicinity of said protrusion and reducing the distance between the electric field and a portion of the distal end of the other region.

2. The CCD structure of claim 1 further comprising a chargeable electrode disposed above said first and second regions and capable of receiving a timed pulse of electrical energy for altering the electric field in the first and second regions.

3. The CCD structure of claim 1 further comprising a layer in said substrate disposed above said first and second regions and comprising a concentration of immobile impurities of a polarity opposite to the polarity of the first and second regions for providing a virtual electrode above said first and second regions.

4. The CCD device of claim 1 wherein the concentration of impurities in the first region is greater than the concentration of carriers in the second region.

5. The CCD device of claim 1 wherein the protrusion has a tapered shape that narrows in a direction toward said distal end of said first region.

6. The CCD device of claim 1 wherein the different impurity concentrations in the regions are formed by selected differential doping of said substrate.

7. The CCD structure of claim 1 further comprising:
   a second pair of first and second elongated regions, each having an immobile impurities of the same polarity as the first pair but of different concentration from each other and different from the concentrations of either region in said first pair of regions, said second pair of regions having distal and adjoining proximate ends, a boundary defined by the different concentrations of impurities at said adjoining proximate ends, and a protrusion from one region extending into the other region toward the distal end of the other region to alter the gradient of the electric field in the vicinity of the protrusion;
   a chargeable electrode disposed above said first pair of regions and capable of receiving a timed pulse of electrical energy for altering the electric field in the first pair regions;
   a layer in said substrate disposed above said second pair of regions and comprising a concentration of immobile impurities of a polarity opposite to the polarity of the second pair of regions for providing a virtual electrode above said second pair of regions.

8. The CCD device of claim 7 wherein the concentration of impurities in either of the second pair of regions is less than the concentration of impurities in either of the first pair of regions.

9. The CCD device of claim 7 wherein the different impurity concentrations in the respective regions are formed by selected differential doping of the substrate.

10. The CCD device of claim 7 further comprising a third elongated region adjoining said second region of said second pair of regions, said third region having an immobile impurity concentration different from any other region and of the same polarity as said other regions.

11. The CCD device of claim 10 wherein the concentration of impurities in either of the second pair of regions is less than the concentration of impurities in either of the first pair of regions and the concentration of impurities in the third region is less than the concentration of the second region of the second pair and greater than the concentration of the first region of the first pair.

12. The CCD device of claim 10 wherein the different impurity concentrations in the respective regions are formed by selected differential doping of the substrate.

* * * * *